United States Patent
Yang et al.

(10) Patent No.: US 7,460,041 B2
(45) Date of Patent: Dec. 2, 2008

(54) ARITHMETIC DECODING SYSTEM AND APPARATUS BASED ON AN ADAPTIVE CONTENT

(75) Inventors: Kai Yang, Shenzhen (CN); Lin Wang, Shenzhen (CN); Bo Lin, Shanzhen (CN); Wei Yu, Shenzhen (CN)

(73) Assignee: Huawei Technologies Co. Ltd., Shenzen (CN)

(*) Notice: Subject to any disclaimer, the term of this patent is extended or adjusted under 35 U.S.C. 154(b) by 0 days.

(21) Appl. No.: 11/499,625

(22) Filed: Aug. 3, 2006

(65) Prior Publication Data

US 2007/0030180 A1    Feb. 8, 2007

(30) Foreign Application Priority Data

Aug. 4, 2005    (CN) .................. 2005 1 0088392

(51) Int. Cl.
*H03M 7/00* (2006.01)
(52) U.S. Cl. .................. 341/107; 341/51; 341/106; 382/247
(58) Field of Classification Search ............ 341/107
See application file for complete search history.

(56) References Cited

U.S. PATENT DOCUMENTS

| | | | |
|---|---|---|---|
| 4,862,167 A * | 8/1989 | Copeland, III | 341/107 |
| 6,229,463 B1 | 5/2001 | Van Der Vleuten et al. | |
| 6,856,701 B2 * | 2/2005 | Karczewicz et al. | 382/247 |
| 6,876,317 B2 * | 4/2005 | Sankaran | 341/107 |
| 6,894,628 B2 * | 5/2005 | Marpe et al. | 341/107 |
| 7,245,242 B2 * | 7/2007 | Hu et al. | 341/107 |
| 2004/0240559 A1 * | 12/2004 | Prakasam et al. | 375/240.25 |
| 2005/0088324 A1 * | 4/2005 | Fuchigami et al. | 341/107 |
| 2006/0209965 A1 * | 9/2006 | Tseng | 375/240.25 |

FOREIGN PATENT DOCUMENTS

| | | |
|---|---|---|
| CN | 1174634 C | 8/1999 |
| CN | 1610265 | 4/2005 |
| WO | WO 03/091942 | 11/2003 |

OTHER PUBLICATIONS

Osorio et al. "Arithmetic Coding Architecture for H.264/AVC CABAC Compression System". *Euromicro Symposium on Digital System Design (DSD'04)*. 2004. pp. 62-69.

* cited by examiner

*Primary Examiner*—Khai M Nguyen
(74) *Attorney, Agent, or Firm*—Merchant & Gould P.C.

(57) ABSTRACT

The present invention relates to an arithmetic decoding system and apparatus based on the adaptive content. The system includes a control unit, a decoding unit and an interface unit. The control unit fills the code stream data into the decoding unit and configures and controls the decoding unit through the interface unit. The decoding unit performs a decoding for all the syntax elements from the code stream data in the macro block, assembles the syntax elements and transmits them to the control unit. The interface unit transfers the interaction information between the decoding unit and the control unit. The present invention obtains syntax elements by the CABAC decoding through hardware so that the decoding efficiency is highly improved and the requirements for the video processing speed and the data processing capacity of the real-time and high definition applications are satisfied.

22 Claims, 7 Drawing Sheets

ARITHMETIC DECODING SYSTEM AND APPARATUS BASED ON AN ADAPTIVE CONTENT

FIELD OF THE INVENTION

The present invention relates to video communication fields, and more particularly to an arithmetic decoding system and apparatus based on an adaptive content.

BACKGROUND OF THE INVENTION

The CABAC (Context-based Adaptive Binary Arithmetic Coding) is one of the two entropy-coding schemes adopted in the international video coding standard H. 264. Compared with the other entropy-coding scheme CAVLC (Context-based Adaptive Variable Length Coding), the CABAC has a higher compressing efficiency but is also more complicated in implementation.

The function of the entropy-coder is to code the values of all the syntax elements in each macro-block (MB) into the code stream (also referred to as "bit stream") successively according to the MB scan order. MB is a basic unit block in the video image coding and each image is divided into MBs and then coded.

The CABAC arithmetic decoding is based on the principle of space recursion partition. When decoding the current bin, the probability of the current bin being 0 or 1 is required to know, which is represented by p and is decided by the content probability model corresponding to the current bin. The more probable symbol (MPS) and the less probable symbol (LPS) should be firstly differentiated and they correspond to 0 or 1 respectively. The value of LPS (valLPS) and the value of MPS (valMPS) are represented by 0 and 1 and applied in the content probability model corresponding to the decoding of the current bin. If the value of MPS corresponding to the current bin is represented by p(0), the value of LPS is represented by p(1)=1−p(0).

The space range of the dualized probability is (0, 1) and the whole space is determined by the value of codIRange. The range of the subinterval is calculated by the probability value p corresponding to the decoding of the current bin such that the range of the MPS space corresponds to p(0)*codIRange and the range of the LPS space corresponds to codIRange−p(0)*codIRange. After the probability space is determined, within which subinterval the probability value corresponding to the decoding of the current bin is can be determined according to the value of codIOffset. If the probability is within the LPS space, the value corresponding to the decoding of the current bin corresponds to the valLPS; and if the probability is within the MPS space, the value corresponding to the decoding of the current bin corresponds to the valMPS. If the probability is within the MPS space, the value of the MPS space p(0)*codIRange is considered as the whole probability space codIRange when decoding the next bin so as to continually partition the space and perform decoding. The above is only a brief illustration of the CABAC decoding, and as to the detailed illustration of the CABAC decoding, please refer to H. 264 protocol, which is cited here for reference and will not be illustrated in detail.

For example, in the maintenance of the content probability model, the probability evaluation is accomplished through a group of Finite State Machines, which are based on a probability state table covering 64 different probability events. The probability state table is represented by {pLPS (pStateIdx)|0<=pStateIdx<64}.

Each value in the table corresponds to a LPS value pLPS. The table is organized according to the principle that with the increase of the pStateIdx value, the LPS value decreases and when pStateIdx=0, the corresponding LPS value is 0.5.

The CABAC algorithm was instituted and proposed on the JVT (the joint group of MPEG of ITU-T international video organization ISO) conference in 2003. Since the CABAC algorithm has developed a comparatively short period of time, proposed structures for realizing an integrated decoding are quite few, especially the high speed and high throughput real-time decoding processor.

The known CABAC hardware-decoding units mainly have the architecture of software decoding and the combination of the software decoding and the hardware decoding.

The CABAC software/hardware-decoding units can refer to the jm95 software provided by JVT. The software decoding performs the decoding procedure on the PC according to the algorithm flow and the software is responsible for all the CABAC decoding tasks. However, the decoding speed is slow and the need of real-time applications cannot be satisfied.

"Arithmetic coding architecture for H.264/AVC CABAC compression system", Digital System Design, 2004. DSD 2004. Euromicro Symposium on, 31 Aug.-3 Sep. 2004 Page 62-69 by Osorio, R. R.; Bruguera, J. D. provides a hardware-decoding unit architecture with the combination of the software and the hardware, which adopts the hardware speedup mode. The decoding for the coefficient syntax element, which occupies the most workload is realized by the hardware speedup architecture, and the decoding for other syntax elements such as the mb_type, sub_mb_type, CBP (Coded Block Patterns), dquant, brightness predicting mode, chroma predicting mode, MVD (Motion Vector Data) and reference frame index etc., are all realized by the software. Such kind of decoding architecture has a higher efficiency than the software-hardware combined decoding unit. However in the decoding architecture, the hardware only performs the decoding for one kind of syntax element in the macro block, i.e. the decoding for the coefficient, while the software performs the decoding for other syntax elements; and the interaction between the hardware and the software not only relates to the border macro block information but also relates to the continuous interaction in the software and hardware decoding procedure for the Range and Offset variables generated during the CABAC decoding process, which may lead to the unclear function designation of the software and the hardware, to the complex interaction procedure and to the low efficiency.

Moreover, in the decoding architecture, the software is responsible for the decoding for all the syntax elements except the coefficient and the hardware is only responsible for the decoding for the coefficient, which may result in the resource waste to some extent.

In brief, in the prior art, the software performs the decoding for all or the majority of syntax elements in the macro block, which may lead to the low efficiency of CABAC decoding and complex realization and cannot satisfy the requirements for the video processing speed and the data processing capacity of the real-time and high definition applications.

In brief, in the prior art, the software performs the decoding for all or the majority of syntax elements in the macro block, which may lead to the low efficiency of CABAC decoding and complex realization and cannot satisfy the requirements for the video processing speed and the data processing capacity of the real-time and high definition applications.

SUMMARY OF THE INVENTION

The present invention provides an arithmetic decoding system based on the adaptive content. The system includes a control unit, a decoding unit and an interface unit, in which the control unit fills the code stream data into the decoding unit and configures and controls the decoding unit through the interface unit; the decoding unit performs a decoding for all the syntax elements from the code stream data in the macro block, assembles the syntax elements and transmits them to the control unit; and the interface unit transfers the interaction information between the decoding unit and the control unit.

Preferably, the decoding unit includes a decoding control unit, a decoding management unit and a decoding information management unit, in which the decoding control unit connects the decoding management unit and the decoding information management unit, receives the decoding control signal from the control unit and outputs the control signal of all the syntax elements in the code stream data to the decoding management unit and the decoding information management unit; the decoding management unit receives the decoding control signal from the decoding unit and in the macro block performs the decoding for all the syntax elements from the code stream data filled in the decoding unit; and the decoding information management unit stores the content probability models, selects a content probability model required by decoding each bin for the current syntax element according to the border block and macro block information and outputs the selected model to the decoding management unit for decoding.

Preferably, the decoding management unit includes a code stream management module, a single bin decoding unit and a regrouping bin module, in which the code stream management stream receives the code stream data and inputs the code stream data to the single bin decoding module; the single bin decoding module decodes the code stream data inputted by the code stream management module and outputs the decoding result to the regrouping bin module; and the regrouping bin module assembles the single bin decoding result outputted from the single bin decoding module into syntax elements, inputs the syntax elements through the interface unit to the control unit and considers the syntax elements of the border block information needed in the subsequent decoding as the reference information when performing the decoding for the later syntax elements.

Preferably, the decoding information management unit includes a content probability model selecting module, a content probability model memory and a border block information maintaining module, in which the content probability model memory stores the content probability models needed when performing the decoding for the syntax elements; the border block information maintaining module maintains the border macro block information needed when decoding the current macro block; and the content probability model selecting module selects the content probability model needed when decoding each bin for the current syntax element according to the border macro block and the macro block information provided by the border block information maintaining module and outputs an indication signal of the content probability model to the content probability model memory.

Preferably, the decoding information management unit further includes a content probability model buffer, which is used to buffer the content probability model needed when performing the decoding for the syntax elements, to transmit the corresponding content probability model to the single bin decoding module according to the indication signal of the content probability model outputted from the content probability model selecting module, and to receive the content probability model updated by the single bin decoding module and write the updated content probability model to the content probability model memory.

Preferably, the code stream management module further includes a code stream memory, which is used to store the code stream data and to provide the code stream data to the single bin decoding module.

Preferably, the border block information maintaining module further includes a first group of registers for storing the information of the left neighboring macro block and a second group of registers for storing the information of the upper neighboring macro block.

Preferably, the content probability model buffer further includes a register group and the register group comprises a plurality of registers for buffering the content probability model needed by the single bin decoding module.

Preferably, the interface unit further includes a decoding circuit for decoding the address of the read-write data from the control unit to the interface unit, a configuration register group for storing the decoding configuration information written by the control unit through the decoding circuit and an output result register and an output result register group for storing the decoding results inputted by the single bin decoding module.

Preferably, the interaction information includes the code stream data, the border macro block information and the decoding control signal, and the decoding control signal comprises the start signal of the skip decoding, the start signal of the field decoding and the start signal of the mb_layer decoding.

In order to better realize the object of the present invention, the present invention further provides an arithmetic decoding apparatus based on the adaptive content. The decoding apparatus is realized by hardware, which is used to obtain all the syntax elements by decoding the code stream data needed to be decoded in the macro block and to assemble the syntax elements and then transmit them.

Preferably, the decoding apparatus includes a decoding control unit, a decoding management unit and a decoding information management unit, in which the decoding control unit connects the decoding management unit and the decoding information management unit, receives the decoding control signal and outputs the control signal of all the syntax elements in the code stream data to the decoding management unit and the decoding information management unit; the decoding management unit receives the decoding control signal from the decoding unit and in the macro block performs the decoding for all the syntax elements from the code stream data filled in the decoding unit; and the decoding information management unit stores the content probability models, selects a content probability model required by decoding each bin for the current syntax element according to the border block and macro block information and outputs the selected model to the decoding management unit for decoding.

Preferably, the decoding management unit includes a code stream management module, a single bin decoding unit and a regrouping bin module, in which the code stream management stream receives the code stream data and inputs the code stream data to the single bin decoding module; the single bin decoding module decodes the code stream data inputted by the code stream management module and outputs the decoding result to the regrouping bin module; and the regrouping bin module assembles the single bin decoding result outputted from the single bin decoding module into syntax elements, outputs the syntax elements and considers the syntax elements of the border block information needed in the subsequent decoding as the reference information when performing the decoding for the later syntax elements.

Preferably, the decoding information management unit includes a content probability model selecting module, a content probability model memory and a border block information maintaining module, in which the content probability model memory stores the content probability models needed when performing the decoding for the syntax elements; the border block information maintaining module maintains the border macro block information needed when decoding the current macro block; and the content probability model selecting module selects the content probability model needed when decoding each bin for the current syntax element according to the border macro block and the macro block information provided by the border block information maintaining module and outputs an indication signal of the content probability model to the content probability model memory.

Preferably, the decoding apparatus further includes a content probability model buffer, which is used to buffer the content probability model needed when performing the decoding for the syntax elements, to transmit the corresponding content probability model to the single bin decoding module according to the indication signal of the content probability model outputted from the content probability model selecting module, and to receive the content probability model updated by the single bin decoding module and write the updated content probability model to the content probability model memory.

Preferably, the code stream management module further includes a code stream memory, which is used to store the code stream data and to provide the code stream data to the single bin decoding module.

Preferably, the border block information maintaining module further includes a first group of registers for storing the information of the left neighboring macro block and a second group of registers for storing the information of the upper neighboring macro block.

Preferably, the content probability model buffer further includes a register group and the register group comprises a plurality of registers for buffering the content probability model needed by the single bin decoding module.

The present invention uses the hardware to obtain all the syntax elements by the CABAC decoding so that the software and the hardware have clear function designations, the interface is clear, the decoding process is easy to be controlled and realized, the decoding efficiency is highly improved and the requirements for the video processing speed and the data processing capacity of the real-time and high definition applications are satisfied.

DETAILED DESCRIPTION OF THE INVENTION

The present invention will be illustrated in detail with reference to the drawings and embodiments in order to make the solution and advantages of the present invention more apparent. It should be noted that the embodiments here are only for the purpose of illustration and are not intended to limit the scope of the present invention.

In the present invention, the values or the bin values of the neighboring macro blocks are used to calculate the value of the content probability model for decoding the current bin. According to a certain calculating rules, the value of the corresponding content probability model is selected from the RAM (Random Access Memory), which stores the content probability models. The value corresponding to the decoding of the current bin is obtained according to the above calculating rules and the probability of the current bin being 0 or 1 is updated, i.e. the value of the content probability model corresponding to the decoding of the current bin is updated and written to the corresponding RAM space. The above procedure shows that the CABAC decoding is a content based arithmetic decoding. The essence of "content based" is to determine the probable value of the next syntax element according to the value of the former syntax elements obtained from decoding. If the determination is right, the current syntax element can be obtained with little or no consumption of bits so that the aim of improving the code stream compression ratio is achieved.

According to the above solution, the present invention provides a CABAC decoding apparatus in hardware which is used for the decoding for all the syntax elements of CABAC. The parameters of Range and Offset of the CABAC correlative decoding characteristics required in the decoding process and the variables such as the content probability model required to be updated and maintained in the decoding process can be totally maintained by the decoding apparatus itself.

In the CABAC decoding system of the present invention, the decoding process of the decoding apparatus is controlled by the corresponding software, however, the software needn't participate any data maintenance and decoding process of the CABAC decoding itself, but only provides the border macro block information, the code stream data and the control signal. The interaction between the hardware and the software includes the interaction of code stream data, the interaction of the configuration information and the obtainment of the result data after the decoding based on the macro block.

Figure 1:
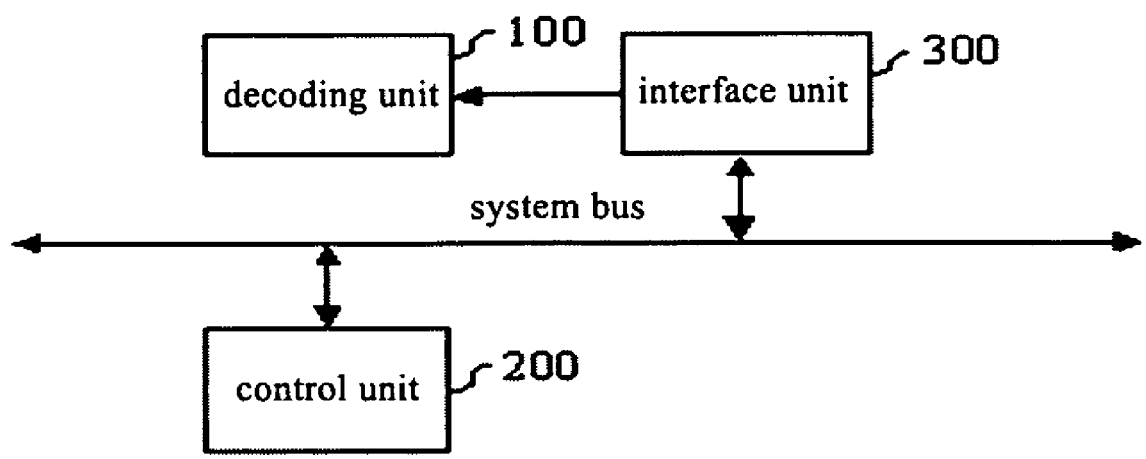
FIG. 1 is a diagram showing the configuration architecture of the decoding system according to an embodiment of the present invention.

FIG. 1 is an architecture diagram of the decoding system according to an embodiment of the present invention. The system is composed of three parts, a decoding unit 100 for the CABAC decoding, a control unit 200 for the configuration and control of the decoding unit 100, and an interface unit 300. The control unit 200 exchanges data with the interface unit 300 through the access bus and controls the decoding unit 100 to perform decoding. The decoding unit 100 is the main part of the CABAC decoding system and implements the decoding for all the syntax elements in the macro block. The control unit 200 transmits the decoding control signal and the code stream data required for decoding to the decoding unit 100 through the interface unit 300, and the decoding unit 100 transmits the decoded data to the control unit 200 through the interface unit 300.

Figure 2:
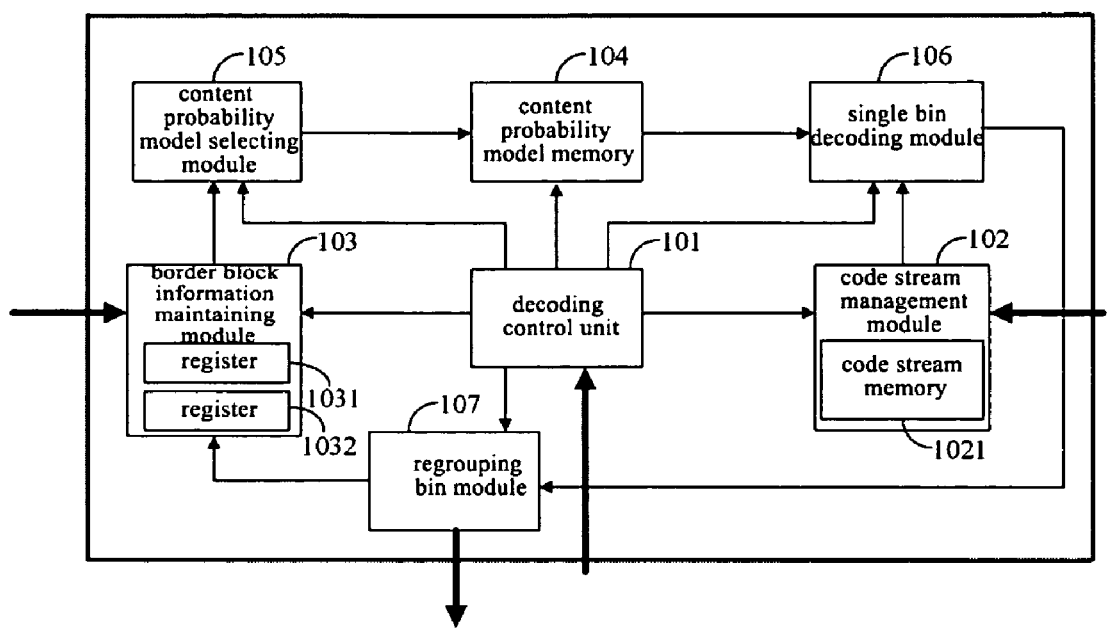
FIG. 2 is a diagram showing the architecture of the decoding unit in the decoding system according to an embodiment of the present invention.

FIG. 2 is an architecture diagram of the decoding unit in the decoding system according to an embodiment of the present invention.

The decoding unit 100 may include a decoding control unit 101, a decoding management unit and a decoding information management unit.

The decoding control unit 101, which is connected to the decoding management unit and the decoding information management unit, receives the decoding control signal from the control unit 200 and outputs the control signal of all the syntax elements decoded from the code stream data to the decoding management unit and the decoding information management unit.

The decoding management unit receives the decoding control signal from the decoding control unit and in the macro block performs decoding to obtain all the syntax elements from the code stream data in the decoding unit.

The decoding information management unit stores the content probability models, selects the content probability model required by each bin in the decoding for the current syntax element according to the border block and macro block information, and then outputs the selected content probability model to the decoding management unit for decoding.

The decoding management unit includes a code stream management module 102, a single bin decoding module 106 and a regrouping bin module 107.

The decoding information management unit includes a content probability model selecting module 105, a content probability model memory 104 and a border block information maintaining module 103.

In practice, the single bin decoding unit 106 and the content probability model selecting module 105 are realized by the combinational circuit, the other module units are realized by the sequential circuit and the whole decoding unit 100 is realized by the digital circuit, which is integrated on an integrated circuit chip.

The decoding control unit 101 is responsible for controlling the decoding processes of other modules in the decoding unit 100 and transmits the decoding control signal to each module to coordinate the operation of each module. The decoding control unit 101 includes a control state machine internally, and realizes the object to perform the decoding for all the syntax elements in the whole macro block through controlling each decoding state.

Figure 3:
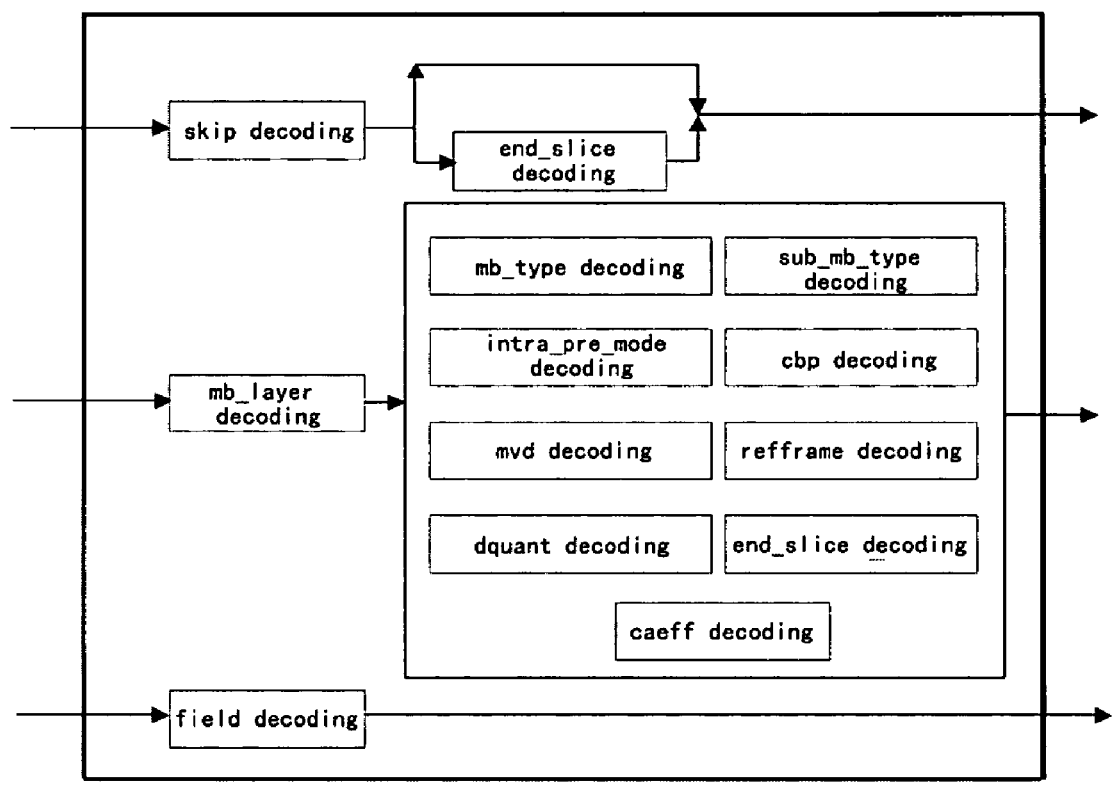
FIG. 3 is a diagram showing the composition of the syntax element obtained from the decoding unit according to an embodiment of the present invention.

FIG. 3 shows the three decoding control processes of the control state machine in the decoding control unit 101, which are the decoding control process of skip state, the decoding control process of field state and the decoding control process of mb_layer state respectively. FIG. 3 contains all the syntax elements of the CABAC coding and decoding adopted in the H.264 protocol (main profile) as follows:

(1) Skip represents the decoding signal showing whether the macro blocks in the frame P are skipped.

(2) End_slice represents the identification signal showing whether the current macro block is the last macro block in the slice layer.

(3) mb_type represents the type signal of the current macro block and sub_mb_type represents the type signal of four 8*8 blocks included in the macro blocks.

(4) Intra_pre_mode represents the brightness prediction mode signal and the chroma prediction mode signal showing the decoding of the 4*4 type when the current macro block is an intra block.

(5) Cbp represents the indication signal showing the coefficient of the current macro block exists.

(6) Dquant represents the quant stagger signal of the current macro block.

(7) Mvd represents the stagger signal showing the motion vector of the current macro block.

(8) Refframe represents the reference frame signal of the current macro block.

(9) Coeff represents the coefficient signal of the current macro block.

(10) Field represents the field identification signal of the current macro block.

An embodiment of the present invention separates the skip decoding and field decoding from the mb_layer decoding, which helps to improve the decoding efficiency and to reduce the cost of the interaction between the software and the hardware to the maximum extent. The skip decoding, field decoding and mb_layer decoding can be respectively controlled by the control unit 200 so as to accomplish the decoding for the corresponding syntax element.

The mb_layer decoding includes the decoding for 9 kinds syntax elements and is the main part of the CABAC decoding. In the mb_layer, the 9 syntax elements are obtained through a certain decoding order and the order is associated with the H.264 protocol. Please refer to the JVT-G050, "Draft ITU-T Recommendation H.264 and Draft ISO/IEC 14496-10 AVC" in JVT of ISO/IEC doc, T. Wig, Ed., Pattaya, Thailand, March 2003, which is incorporated for reference in the present invention and will not be illustration in detail. If the value of the skip is 1 during the skip decoding, the decoding is performed for the end_slice syntax element and the process is ended, and if the value of the skip is 0, the process is ended immediately and the decoding unit 100 performs the next decoding operation.

In the present embodiment, the reason why the skip decoding process is an individual process and is not integrated in the mb_layer decoding is that the configuration information for the skip decoding process is comparatively less while the mb_layer decoding requires much configuration information, and when the macro block is the skip mb, the mb_layer decoding process need not be started. Therefore, the decoding of the whole macro blocks can be accomplished with little configuration information, which is very cost effective.

The field decoding is optional. The reason why this decoding process for the syntax element field is an individual process is that the selecting mode of neighboring macro blocks of this syntax element is different from those of the mb skip decoding and mb_layer decoding in some cases. Therefore, it is necessary to be operated individually by the independent mode of the software-hardware interaction.

According to another embodiment of the present invention, the skip decoding and the field decoding can be combined into the mb_layer decoding, and also, the decoding for certain syntax elements in the mb_layer can be separated from the mb_layer decoding and independently controlled by the control unit 200.

Figure 4:
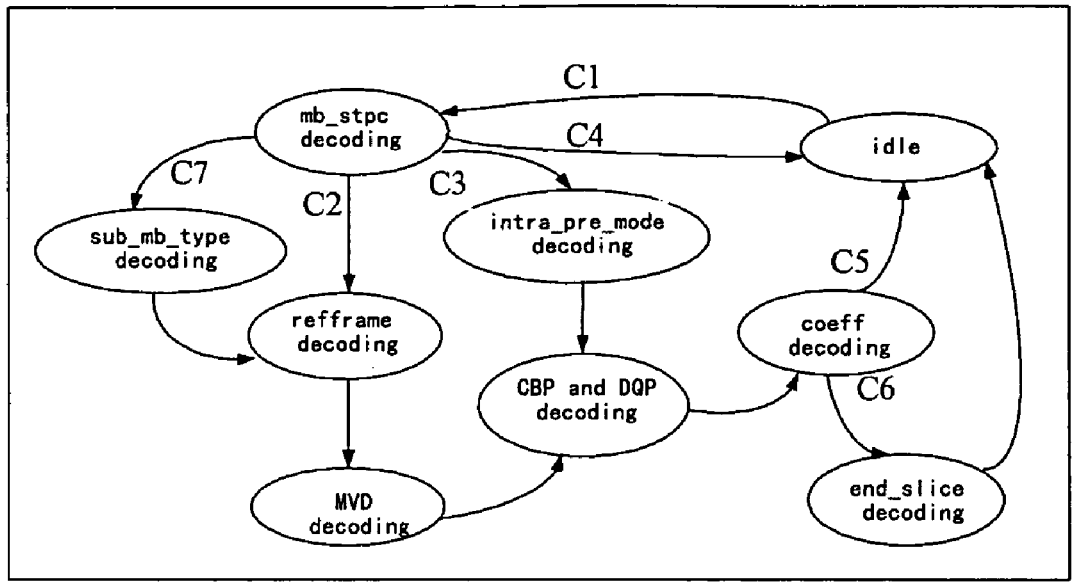
FIG. 4 is a status schematic diagram showing the decoding for the mb_layer syntax elements by the decoding unit according to an embodiment of the present invention.

FIG. 4 shows the detailed state control procedure when the decoding control unit controls the decoding unit 100 to perform the decoding for the syntax elements in the mb_layer (macro block). During the decoding for the syntax elements in the mb_layer, the initial state of the decoding unit 100 is idle. When receiving the effective mb_layer decoding start signal (C1), the decoding unit 100 performs the mb_type decoding.

After the decoding unit 100 finishes the mb_type decoding, if it is the macro block P or macro block B decoding and the macro block partition is not in the form of four 8*8 blocks (C2), the refframe decoding, the mvd decoding, the cbp and dqp decoding and the coeff decoding are performed successively; if it is the macro block I decoding and not the I_PCM mode decoding (C3), the cbp and dqp decoding and the coeff decoding are performed successively; if it is the macro block I decoding and also the I_PCM mode decoding (C4), the flow returns to the idle state; and if it is the macro block P or macro block B decoding and the macro block is in the form of four 8*8 blocks, the sub_mb_type decoding (C7), the refframe decoding, the mvd decoding, the cbp and dqp decoding and the coeff decoding are performed successively.

After the coeff decoding, if it is now in the mbaff decoding mode and the serial number of the current macro block is even (C5), the flow returns to the idle state; and if it is in the non-mbaff decoding mode or in the mbaff decoding mode but the serial number of the current macro block is odd, the send_slice decoding will be performed and then the flow returns to the idle state.

The code stream management module 102 receives the code stream data and transmits the code stream data to the single bin decoding module 106. The code stream management module 102 includes a code stream memory 1021, which is used to provide the code stream data to the single bin decoding module 106. When the code streams in the code stream memory 1021 are going to be consumed, the code stream management module 102 sends a request for the code stream uploading to the control unit 200.

In the macro block decoding process, if the code streams in the code stream memory 1021 are consumed, the code stream management module 102 sends a request for the code stream uploading to the control unit 200. And at this time, the code stream management module 102 interrupts the decoding until the control unit 200 fills the needed code streams.

The border block information maintaining module 103 maintains the border macro block information, and the border macro block information includes the information of the upper neighboring and left neighboring macro blocks. The border block information maintaining module 103 includes two groups of registers 1031 and 1032, which respectively store the information of the left neighboring macro block and that of the upper neighboring macro block. The border macro block information includes whether the neighboring macro block is effective, whether the neighboring macro block is the skip, the frame field mode of the neighboring macro block and the decoded syntax elements in the neighboring macro blocks. When performing the decoding for the syntax element in the current macro block, the already decoded syntax elements in the neighboring macro block are required for the first bin of the syntax element to determine how to choose the probability model. And at this time, the border block information maintaining module 103 is required to provide the border macro block information needed when choosing the probability model to the content probability model selecting module 105.

According to an embodiment of the present invention, the control unit 200 maintains all the border macro block information of the current macro block, and the control unit 200 transfers the border macro block information to the border block information maintaining module 103 through the interface unit 300 when decoding the current macro block. How-ever, the interaction between the software and hardware decoding in such solution is comparatively complex.

In another embodiment of the present invention, the information of the syntax element in the border macro block may be absolutely maintained by the border block information maintaining module 103 in the decoding unit 100 and thus the interaction between the software and the hardware is simple, but the border block information maintaining module 103 needs to maintain the information of the left neighboring macro block and the upper row of the macro blocks, which costs a lot of resources.

According to the preferred embodiment of the present invention, the control unit 200 maintains the information of the syntax element in the upper neighboring macro block and the border block information maintaining module 103 maintains the information of the syntax element in the left neighboring macro block. Therefore, the interaction between the software and the hardware is simple and the resource consumed by the hardware is only the information for maintaining the syntax element in the left neighboring one or two (in mbaff mode) macro blocks.

The content probability model memory 104 is an RAM for storing the probability models needed by all the syntax elements. The total number of the stored probability models in the content probability model memory 104 is 399 and this is all the probability model information needed to decode the whole macro block for all the syntax elements.

The content probability model selecting module 105 includes the probability model selecting strategies of all the bins for all the syntax elements and determines the probability model needed when decoding each bin for the current syntax element. The output of the content probability model selecting module 105 is similar to a pointer indicating which probability model should be selected from those provided by the content probability model memory 104 when the single bin decoding unit 106 decodes each bin for the current syntax element. The principles to determine the probability model are as follows: 1) for which syntax element the decoding is performed now; 2) which bin is decoded to obtain the current syntax element; and 3) the value of the syntax element corresponding to the border macro block. The rules of determining the probability model are described in the H.248 protocol and refer to JVT-G050, "Draft ITU-T Recommendation H.264 and Draft ISO/IEC 14496-10 AVC" in JVT of ISO/IEC doc, T. Wig, Ed., Pattaya, Thailand, March 2003, which will not be illustrated in detail here.

The single bin decoding unit 106 decodes the bin for each syntax element and the decoding mode adopts the CABAC arithmetic decoding method specified by H.264 protocol. Please refer to JVT-G050, "Draft ITU-T Recommendation H.264 and Draft ISO/IEC 14496-10 AVC" in JVT of ISO/IEC doc, T. Wig, Ed., Pattaya, Thailand, March 2003, which will not be illustrated in detail here. The code streams needed in the decoding process are obtained from the code stream management module 102 and the probability models needed in the decoding process are obtained from the content probability model buffer 108. The decoding result of the single bin decoding unit 106 is transmitted to the regrouping bin module 107 and is used to reconstruct the syntax element.

Since the single bin decoding unit 106 decodes only one bin for a syntax element, if the final syntax element is to be recovered from the decoding result of the bins, a regrouping bin process is needed. The regrouping bin module 107 is used to accomplish the assembling of the current syntax element. The assembling manner of each syntax element is different, the assembling is according to the type of the current syntax element, and the assembling principle is according to the H.264 protocol. After the assembling of the syntax elements, the regrouping bin module 107 sends the decoded syntax element to the control unit 200 and sends the syntax elements of the border macro block information needed in the subsequent decoding to the border block information maintaining module 103, which are regarded as the reference information for the decoding for the later syntax element.

Figure 5:
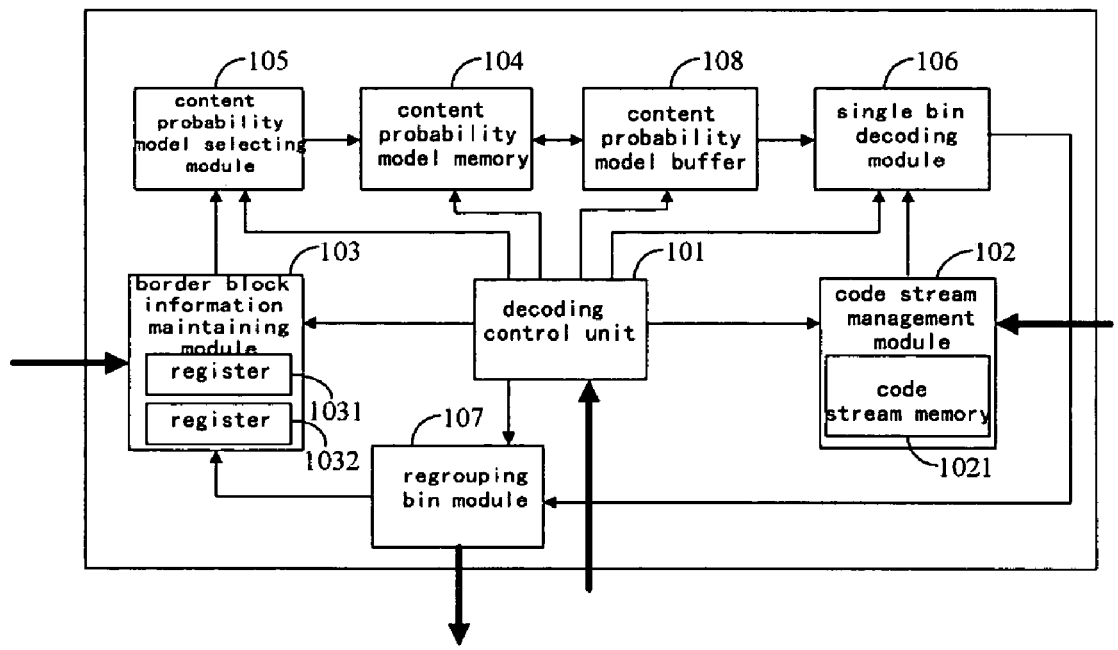
FIG. 5 is a diagram showing the architecture of the decoding unit according to an embodiment of the present invention.

In the above embodiment, the single bin decoding unit 106 directly selects the needed probability model from the content probability model memory 104. Due to the limit of reading the RAM, the selecting and updating of the probability model will greatly influence the decoding efficiency. According to a preferred embodiment of the present invention, the probability model needed in the decoding for a certain type of syntax elements is read into the content probability model buffer 108 as shown in FIG. 5. The content probability model buffer 108 is a cache and provides the high speed buffer for the invoking of the content probability model by the single bin decoding unit 106 so as to improve the efficiency in selecting and updating the content probability model. When receiving the indication signal from the content probability model selecting module 105, the content probability model buffer 108 sends the corresponding probability model to the single bin decoding unit 106.

The corresponding content probability model needs to be updated when decoding each bin. 44 7-bit registers are set in the content probability model buffer 108 in order to avoid loading models from the content probability model memory 104 and writing back the updated content probability model repeatedly. All the content probability models are grouped according to their possible invoking order. During the process of decoding a macro block, each group of the content probability models are loaded into the register group once and are written back after being used and updated and the number of the content probability models in one group is less than or equal to 44.

According to an embodiment of the present invention, all the content probability models are divided into the following 18 groups according to the invoking order of the syntax elements:

the $1^{st}$ group: mb_skip_flag;
the $2^{nd}$ group: mb_field_decoding_flag;
the $3^{rd}$ group: mb_type for SI slice;
the $4^{th}$ group: mb_type for I slice;
the $5^{th}$ group: mb_type for P slice;
the $6^{th}$ group: mb_type for B slice;
the $7^{th}$ group: sub_mb_type for P slice;
the $8^{th}$ group: sub_mb_type for B slice;
the $9^{th}$ group: syntax elements for intra prediction mode, including prev_inrta4×4_pred_mode_flag,rem_intra4×4_pred_mode, intra_chroma_pred_mode;
the $10^{th}$ group: ref_idx;
the $11^{th}$ group: abs_mvd;
the $12^{th}$ group: coded_block_pattern;
the $13^{th}$ group: mb_dq_delta;
the 14th group: and the decoding of DC coefficient in intra16*16 luminance mode for the coded_block_flag, significant_coeff_flag, last_significant_coeff_flag, coeff_abs_level_minus1;
the 15th group: the decoding of AC coefficient in intra16*16 luminance mode for the coded_block_flag, significant_coeff_flag, last_significant_coeff_flag, coeff_abs_level_minus1;
the 16th group: the decoding of coefficient not in the intra16*16 luminance mode for the coded_block_flag, significant_coeff_flag, last_significant_coeff_flag, coeff_abs_level_minus1;
the 17th group: and the decoding of DC coefficient in the chroma mode for the coded_block_flag, significant_coeff_flag, last_significant_coeff_flag, coeff_abs_level_minus1;
the 18th group: and the decoding of AC coefficient in the chroma mode for the coded_block_flag, significant_coeff_flag, last_significant_coeff_flag, coeff_abs_level_minus1.

It should be noted that the grouping manner of the above content probability models is flexible if it can guarantee that the content probability models needed in the decoding for a certain type of syntax elements can be accessed through the content probability model buffer 108.

The control unit 200 is the computer program for the configuration and control of the CABAC decoding process of the decoding unit 100. The control unit 200 is loaded and operated in the CPU (Central Processing Unit) or DSP (Digital Signal Processor) and realizes the decoding configuration and control of the decoding unit 100 through the interface unit 300, which specifically includes as follows:

(1) Initializing the decoding unit 100;
(2) Configuring the border macro information and the code stream data needed in the CABAC decoding process;
(3) Reading the decoding result data from the decoding unit 100;
(4) Sending a control signal to control the decoding unit 100 to perform the CABAC decoding process.

According to an embodiment of the present invention, before decoding the macro block, the control unit 200 checks if the decoding unit needs to be filled with code streams, if yes, it fills the needed code streams and then starts the decoding flow of the macro block.

Figure 6:
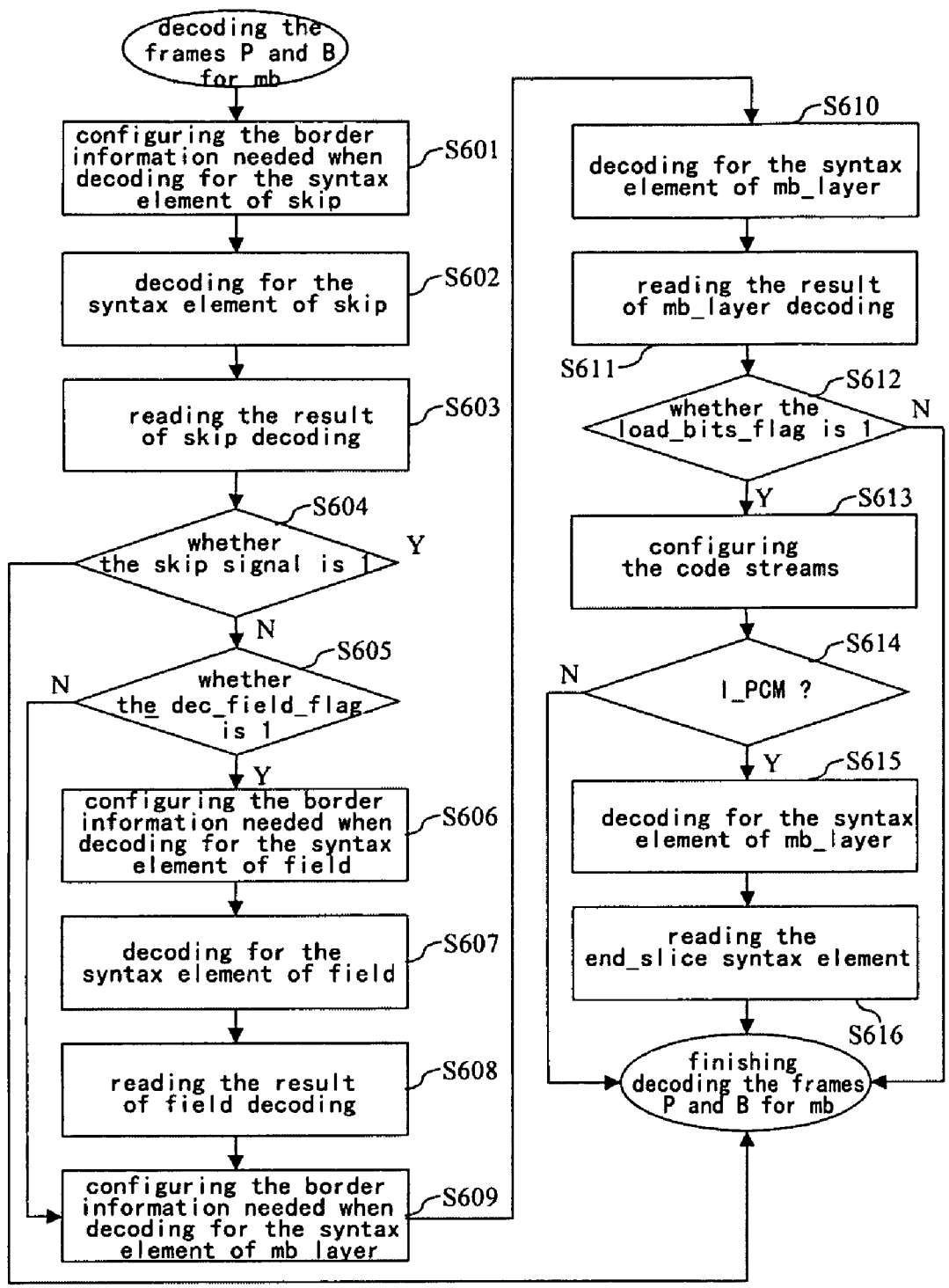
FIG. 6 is a flow chart showing the decoding of the macro blocks of frames P and B according to an embodiment of the present invention.
Figure 7:
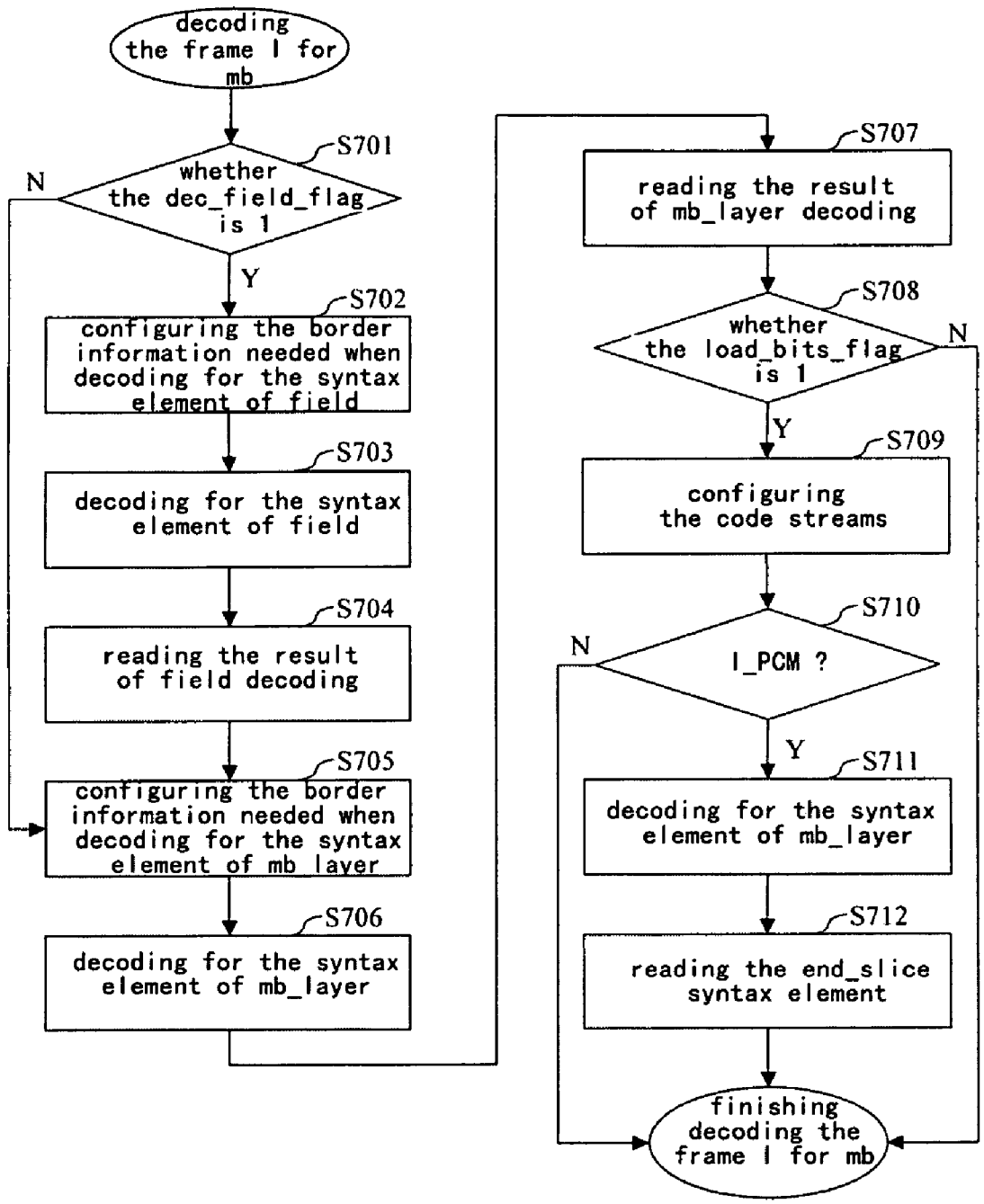
FIG. 7 is a flow chart showing the decoding of the macro blocks of frame I according to an embodiment of the present invention.

FIG. 6 and FIG. 7 respectively show the flows of decoding the frames P, B and I by the decoding unit 100 under the control of the control unit 200.

The whole flow can be divided into two parts: one is the control unit 200 configures the decoding unit 100, i.e. the control unit writes the configuration data, code streams and control data in the decoding unit 100, the other is the control unit 200 reads the data from the decoding unit 100 and the read data indicate the corresponding syntax elements obtained by the decoding unit 100 through the configuration and decoding control of the control unit 200.

The configuration process of the decoding unit 100 by the control unit 200 includes configuring the skip decoding information, field decoding information, mb_layer decoding information and code streams. The reading data process from the decoding unit 100 by the control unit 200 includes reading the skip information, field information, decoding information of the mb_layer and end_slice information.

FIG. 6 and FIG. 7 show the difference between the decoding of the frames P or B and that of the frame I decoding is that the control unit 200 adds a skip decoding control process to the configuration of the decoding unit 100. If the value of the decoded skip is 1, the decoding of the whole macro block is finished, otherwise, the decoding of the macro block for the syntax elements is performed continuously and this process is the same with the control process of the frame I decoding.

The following is the description of the decoding process of the frame P and the frame B:

In Step S602, the control unit 200 configures the border macro block information needed when performing the decoding for the syntax element of skip for the decoding unit 100, and then sends the start signal of the skip decoding.

In Step S602, after receiving the start signal, the decoding unit 100 begins to perform the decoding for the syntax element of skip.

In Step S603, the control unit 200 reads the value of the decoded skip from the decoding unit 100.

In Step S604, the control unit 200 determines whether the value of skip is 1, if yes, the decoding of the whole macro block is finished, otherwise, the procedure proceeds to the step S605.

In Step S605, the control unit 200 determines whether the decoding should be performed for the syntax element of field, i.e. whether the dec_field_flag is 1, if yes, the procedure proceeds to the step S606, otherwise, the procedure proceeds to the step S609.

In Step S606, the control unit 200 configures the needed border macro block information for the decoding unit 100 and sends the start signal of the field decoding. The prerequisites for the field decoding are that it's in the mbaff mode and the macro block under decoding is the upper one of a macro block pair, or the macro block under decoding is the lower one of the macro block pair and the upper macro block is a skip macro block.

In Step S607, after receiving the start signal, the decoding unit 100 performs the decoding for the syntax element of field.

In Step S608, after the decoding unit 100 finishes the field decoding, the control unit 200 reads the result data of the field decoding.

In Step S609, the control unit 200 configures the border macro block information needed in the mb_layer decoding for the decoding unit 100, and then sends the start signal of the mb_layer decoding.

In Step S610, after receiving the start signal, the decoding unit 100 performs the decoding for the syntax elements in the mb_layer.

In Step S611, after the decoding unit 100 finishes the decoding, the control unit 200 reads the result data of the mb_layer decoding.

In Step S612, the decoding unit 100 determines whether the load_bits_flag is 1, i.e. whether the code streams should be filled into the decoding unit 100, if yes, the procedure proceeds to the step S613, otherwise the flow is ended.

In Step S613, the decoding unit interrupts internally and requests the control unit 200 to fill code streams into the decoding unit 100. After the fill of the code streams, the decoding unit 100 cancels the internal interrupting automatically and resumes the decoding. It should be noted that after the mb_layer decoding, the control unit 200 checks if the code stream memory 1021 in the decoding unit 100 is empty, if yes, the control unit 200 fills the code streams into the decoding unit 100 so as to make the code stream memory 1021 in the decoding unit 100 full and to reduce the interrupting times due to the exhaust of code streams during the mb_layer decoding since too many interrupting times can reduce the decoding efficiency of the decoding unit 100.

In Step S614, if the control unit 200 determines that in the mb_layer decoding the current macro block is an I_PCM type, the control unit 200 acquires the information indicating the code streams are exhausted from the decoding unit 100, recovers those which are corresponding to the I_PCM among the code streams outside the decoding unit 100 to the image of the macro block, and refills the remaining code streams into the decoding unit 100. The code stream memory 1021 in the decoding unit 100 is defaulted to be null in this code stream filling process.

In Step S615, the decoding unit 100 performs the decoding for the syntax elements in the mb_layer of the code streams refilled by the control unit 200.

In Step S616, the decoding unit 100 performs the decoding for the end_slice syntax elements. End_slice syntax elements are usually obtained in the mb_layer decoding and are read by the control unit 200. But when the macro block is of I_PCM type, the control unit 200 has to recover the macro block to the I_PCM data and to refill the code streams into the decoding unit 100 and then the decoding unit 100 performs the decoding for the end_slice. After the decoding of the decoding unit 100, the control unit 200 reads the end_slice syntax elements.

FIG. 7 shows the decoding process of the frame I, and the steps S701~712 are the same with the above steps S605~616, which will not be illustrated in detail here.

The interface unit 300 is responsible for the transmission of the interaction information between the decoding unit 100 and the control unit 200. The interface unit 300 transmits the code streams, border macro block information and control signal to be configured in the decoding process to the decoding unit 100 and the border macro block information includes following signal and information:

(1) the avaible_flag signal showing whether the neighboring blocks exist;

(2) the skip_flag signal showing whether the neighboring macro block is a skip block;

(3) the field_flag signal showing the neighboring macro block frame field mode;

(4) the neighboring macro block type signal and sub_mb_type signal;

(5) the neighboring macro block CBP signal and CBF signal;

(6) the signal showing whether the neighboring block is an inside-frame macro block or between-frames macro block;

(7) the neighboring macro block chroma prediction mode signal;

(8) the neighboring macro block dquant signal;

(9) the information of the reference frame, and the mvd of the neighboring macro blocks;

(10) the signal showing whether the current slice is in the mbaff mode;

(11) the current slice type signal, i.e. determining whether the current frame is frame I, frame P or frame B;

(12) the information of num_refidx0_minus1, num_refidx1_minus1, slice_data_partition and constrained_intra_predflag obtained in decoding the current slice header.

The interface unit 300 includes a series of registers and a group of RAMs. The interface unit 300 sets an address for each register and for each data segment in the RAM respectively. The control unit 200 interacts with the interface unit 300 through accessing these addresses and writing and reading the data corresponding to these address segments.

Figure 8:
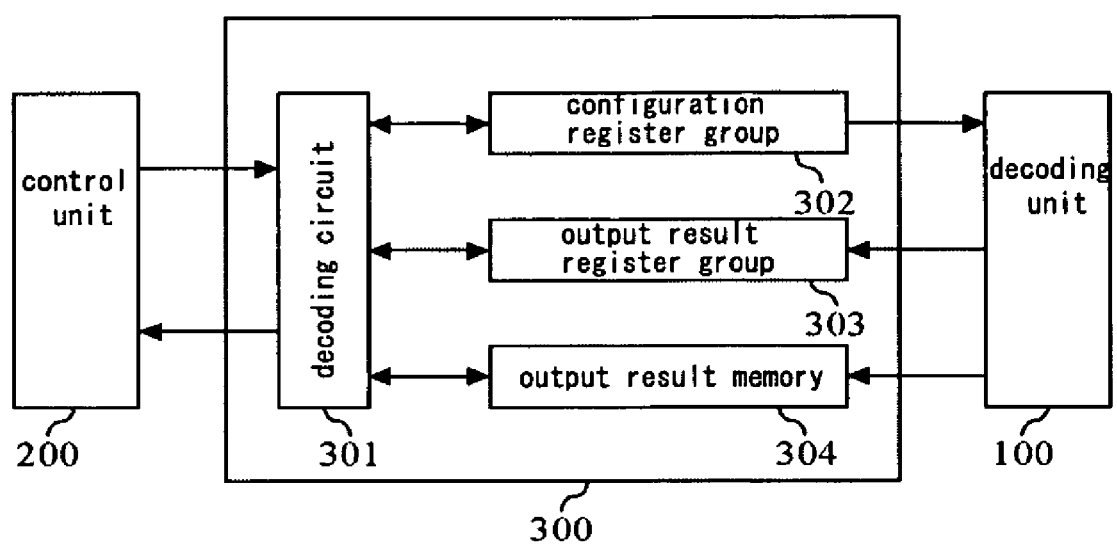
FIG. 8 is an architecture diagram of the interface unit in the decoding system according to an embodiment of the present invention.

FIG. 8 shows the interface unit 300 includes a decoding circuit 301, a configuration register group 302, an output result register group 303 and an output result memory 304.

The decoding circuit 301 implements the address decoding from the control unit 200 to the interface unit 300 so that the control unit 200 can write data into and read data from the interface unit 300.

The configuration register group 302 stores the configuration information for controlling the decoding of the decoding unit 100, and the configuration information is written by the control unit 200 through the decoding circuit 301.

The decoding unit 100 writes the decoding result directly into the interface unit 300, in which the MVD data and coeff data are written into the output result memory 304 and the other syntax elements are directly written into the output result register group 303. The control unit 200 can read the result data obtained by the decoding unit 100 by reading the data in the corresponding addresses.

It should be noted that in the present invention, the interface unit 300 has a plurality of methods in configuring the neighboring macro block. It can configure the complete information of the upper neighboring macro block and the left neighboring macro block, can only configure the information of the upper neighboring macro block but not the information of the left neighboring macro block while the information of the left neighboring macro block is maintained by the decoding unit 100 itself, and can only configure the control signal and the information of all the other reference syntax elements is maintained by the decoding unit 100.

Though illustration and description of the present invention have been given with reference to preferred embodiments thereof, it should be appreciated by ordinary personnel skilled in the art that various changes in forms and details can be made without deviation from the spirit and scope of this invention as defined by the appended claims.

The invention claimed is:

1. An arithmetic decoding system based on an adaptive content comprising a control unit, a decoding unit and an interface unit, wherein:
    the control unit fills code stream data into the decoding unit and configures and controls the decoding unit through the interface unit;
    the decoding unit performs a decoding for all syntax elements from the code stream data in a macro block, assembles the syntax elements and transmits them to the control unit; and
    the interface unit transfers interaction information between the decoding unit and the control unit, and
    the decoding unit comprising a decoding control unit, a decoding management unit and a decoding information management unit, wherein:
    the decoding control unit connects the decoding management unit and the decoding information management unit, receives a decoding control signal from the control unit and outputs the control signal of all the syntax elements in the code stream data to the decoding management unit and the decoding information management unit;
    the decoding management unit receives the decoding control signal from the decoding unit and in the macro block performs the decoding for all the syntax elements from the code stream data filled in the decoding unit; and
    the decoding information management unit stores the content probability models, selects a content probability model required by decoding each bin for the current syntax element according to the border block and macro block information and outputs the selected model to the decoding management unit for decoding.

2. The decoding system according to claim 1, the decoding management unit comprising a code stream management module, a single bin decoding unit and a regrouping bin module, wherein:
    the code stream management stream receives the code stream data and inputs the code stream data to the single bin decoding module;
    the single bin decoding module decodes the code stream data inputted by the code stream management module and outputs the decoding result to the regrouping bin module; and
    the regrouping bin module assembles the single bin decoding result outputted from the single bin decoding module into syntax elements, inputs the syntax elements through the interface unit to the control unit and considers the syntax elements of the border block information needed in the subsequent decoding as the reference information when performing the decoding for the later syntax elements.

3. The decoding system according to claim 2, the decoding information management unit comprising a content probability model selecting module, a content probability model memory and a border block information maintaining module, wherein:
    the content probability model memory stores the content probability models needed when performing the decoding for the syntax elements;
    the border block information maintaining module maintains the border macro block information needed when decoding the current macro block; and
    the content probability model selecting module selects the content probability model needed when decoding each bin for the current syntax element according to the border macro block and the macro block information provided by the border block information maintaining module and outputs an indication signal of the content probability model to the content probability model memory.

4. The decoding system according to claim 3, wherein,
    the decoding information management unit further comprises a content probability model buffer, which is used to buffer the content probability model needed when performing the decoding for the syntax elements, to transmit the corresponding content probability model to the single bin decoding module according to the indication signal of the content probability model outputted from the content probability model selecting module, and to receive the content probability model updated by the single bin decoding module and write the updated content probability model to the content probability model memory.

5. The decoding system according to claim 4, wherein,
    the content probability model buffer further comprises a register group and the register group comprises a plurality of registers for buffering the content probability model needed by the single bin decoding module.

6. The decoding system according to claim 5, wherein,
    the interaction information comprises the code stream data, the border macro block information and the decoding control signal, and the decoding control signal comprises the start signal of the skip decoding, the start signal of the field decoding and the start signal of the mb_layer decoding.

7. The decoding system according to claim 3, wherein,
    the border block information maintaining module further comprises a first group of registers for storing the information of the left neighboring macro block and a second group of registers for storing the information of the upper neighboring macro block.

8. The decoding system according to claim 3, wherein,
    the interface unit further comprises a decoding circuit for decoding the address of the read-write data from the control unit to the interface unit, a configuration register group for storing the decoding configuration information written by the control unit through the decoding circuit and an output result register and an output result register group for storing the decoding results inputted by the single bin decoding module.

9. The decoding system according to claim 2, wherein,
    the code stream management module further comprises a code stream memory, which is used to store the code stream data and to provide the code stream data to the single bin decoding module.

10. The decoding system according to claim 2, wherein,
    the interface unit further comprises a decoding circuit for decoding the address of the read-write data from the control unit to the interface unit, a configuration register group for storing the decoding configuration information written by the control unit through the decoding circuit and an output result register and an output result register group for storing the decoding results inputted by the single bin decoding module.

11. The decoding system according to claim 1, wherein, the interaction information comprises the code stream data, border macro block information and a decoding control signal, and the decoding control signal comprises a start signal of skip decoding, a start signal of field decoding and a start signal of mb_layer decoding.

12. A decoding apparatus based on an adaptive content, the decoding apparatus comprising a decoding control unit, a decoding management unit and a decoding information management unit, wherein:

the decoding control unit connects the decoding management unit and the decoding information management unit, receives a decoding control signal and outputs the control signal of all syntax elements in code stream data to the decoding management unit and the decoding information management unit;

the decoding management unit receives the decoding control signal from the decoding unit and in a macro block performs the decoding for all the syntax elements from the code stream data filled in the decoding unit; and the decoding information management unit stores content probability models, selects a content probability model required by decoding each bin for the current syntax element according to information of the macro block and its border blocks and outputs the selected model to the decoding management unit for decoding.

13. The decoding apparatus according to claim 12, the decoding management unit comprising a code stream management module, a single bin decoding unit and a regrouping bin module, wherein:

the code stream management stream receives the code stream data and outputs the code stream data to the single bin decoding module;

the single bin decoding module decodes the code stream data inputted by the code stream management module and outputs the decoding result to the regrouping bin module; and the regrouping bin module assembles the single bin decoding result outputted from the single bin decoding module into syntax elements, outputs the syntax elements and considers the syntax elements of the border block information needed in the subsequent decoding as the reference information when performing the decoding for the consequent syntax elements.

14. The decoding apparatus according to claim 13, the decoding information management unit comprising a content probability model selecting module, a content probability model memory and a border block information maintaining module, wherein:

the content probability model memory stores the content probability models needed when performing the decoding for the syntax elements;

the border block information maintaining module maintains the border macro block information needed when decoding the current macro block; and the content probability model selecting module selects the content probability model needed when decoding each bin for the current syntax element according to the border macro block and the macro block information provided by the border block information maintaining module and outputs an indication signal of the content probability model to the content probability model memory.

15. The decoding apparatus according to claim 14, wherein, the decoding information management unit further comprises a content probability model buffer, which is used to buffer the content probability model needed when performing the decoding for the syntax elements, to transmit the corresponding content probability model to the single bin decoding module according to the indication signal of the content probability model outputted from the content probability model selecting module, and to receive the content probability model updated by the single bin decoding module and write the updated content probability model to the content probability model memory.

16. The decoding apparatus according to claim 14, wherein, the border block information maintaining module further comprises a first group of registers for storing the information of the left neighboring macro block and a second group of registers for storing the information of the upper neighboring macro block.

17. The decoding apparatus according to claim 14, wherein, the content probability model buffer further comprises a register group and the register group comprises a plurality of registers for buffering the content probability model needed by the single bin decoding module.

18. The decoding apparatus according to claim 13, wherein, the code stream management module further comprises a code stream memory, which is used to store the code stream data and to provide the code stream data to the single bin decoding module.

19. A decoding method based on an adaptive content, comprising:

obtaining information of a macro block and its border blocks;

after receiving a decoding control signal of decoding the macro block, selecting a content probability model required by decoding each bin for the current syntax element of the macro block according to information of the macro block and its border blocks; and decoding all syntax elements needed to be decoded in the macro block according to the selected content probability model.

20. The method according to claim 19, wherein, the step of selecting the content probability model required by decoding each bin for the current syntax element of the macro block according to information of the macro block and its border blocks comprises:

storing the content probability models needed when decoding all the syntax elements needed to be decoded in the macro block;

maintaining information of the border blocks needed when decoding the current macro block; and selecting the content probability model needed when decoding each bin for the current syntax element of the macro block according to information of the macro block and its border blocks and outputting an indication signal of the content probability model.

21. The method according to claim 20, wherein, the step of selecting the content probability model required by decoding each bin for the current syntax element of the macro block according to information of the macro block and its border blocks further comprises:

buffering the content probability model needed when performing the decoding for the syntax elements;
transmitting the corresponding content probability model according to the indication signal of the content probability model;
receiving a updated content probability model; and
storing the updated content probability model.

22. The method according to claim 20, wherein, the step of maintaining information the border blocks needed when decoding the current macro block comprises:
storing information of a left neighboring macro block and information of an upper neighboring macro block.

* * * * *